US009324779B2

(12) United States Patent
Song et al.

(10) Patent No.: US 9,324,779 B2
(45) Date of Patent: Apr. 26, 2016

(54) TOROID INDUCTOR IN AN INTEGRATED DEVICE

(71) Applicant: QUALCOMM Incorporated, San Diego, CA (US)

(72) Inventors: Young Kyu Song, San Diego, CA (US); Daeik Daniel Kim, San Diego, CA (US); Jonghae Kim, San Diego, CA (US); Xiaonan Zhang, San Diego, CA (US); Ryan David Lane, San Diego, CA (US); Mario Francisco Velez, San Diego, CA (US); Chengjie Zuo, Santee, CA (US); Changhan Hobie Yun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 29 days.

(21) Appl. No.: 14/063,934

(22) Filed: Oct. 25, 2013

(65) Prior Publication Data

US 2015/0115403 A1    Apr. 30, 2015

(51) Int. Cl.
*H01L 49/02* (2006.01)
*H01L 23/522* (2006.01)
*H01L 23/64* (2006.01)

(52) U.S. Cl.
CPC ............ *H01L 28/10* (2013.01); *H01L 23/5227* (2013.01); *H01L 23/645* (2013.01); *H01L 2924/0002* (2013.01); *H01L 2924/15311* (2013.01)

(58) Field of Classification Search
CPC . H01F 17/0033; H01F 41/046; H01F 17/062; H01L 28/10; H05K 1/165; H05K 2201/086; H05K 2201/097; H05K 1/115; Y10T 29/4902; Y10T 29/49073; Y10T 29/49069
USPC .................. 29/602.1; 336/229; 257/E21.022; 438/238, 381
See application file for complete search history.

(56) References Cited

U.S. PATENT DOCUMENTS

| 7,253,711 | B2 | 8/2007 | Pleskach et al. |
| 7,271,697 | B2 | 9/2007 | Whittaker et al. |
| 8,354,325 | B1 | 1/2013 | Dao et al. |
| 2005/0093672 | A1 | 5/2005 | Harding |
| 2010/0180430 | A1 | 7/2010 | Roskos |
| 2013/0187255 | A1* | 7/2013 | Wang et al. .................. 257/531 |

* cited by examiner

*Primary Examiner* — David Vu
*Assistant Examiner* — Jonathan Han
(74) *Attorney, Agent, or Firm* — Loza & Loza, LLP

(57) ABSTRACT

Some novel features pertain to an integrated device that includes a substrate, a first cavity through the substrate, and a toroid inductor configured around the first cavity of the substrate. The toroid inductor includes a set of windings configured around the first cavity. The set of windings includes a first set of interconnects on a first surface of the substrate, a set of though substrate vias (TSVs), and a second set of interconnects on a second surface of the substrate. The first set of interconnects is coupled to the second set of interconnects through the set TSVs. In some implementations, the integrated device further includes an interconnect material (e.g., solder ball) located within the first cavity. The interconnect material is configured to couple a die to a printed circuit board. In some implementations, the interconnect material is part of the toroid inductor.

30 Claims, 11 Drawing Sheets

TOROID INDUCTOR IN AN INTEGRATED DEVICE

BACKGROUND

1. Field

Various features relate to a toroid inductor in an integrated device.

2. Background

Inductors that are located in integrated circuit (IC) packages are limited in their capabilities for supporting high current due to the limited real estate in IC packages. Specifically, since these inductors are located in the packaging substrate of IC packages, the size of these inductors is limited by the size of the packaging substrate of IC packages. As a result of the restricted space in the packaging substrate of IC packages, these inductors typically have a high resistance and a low quality (Q) factor.

FIG. 1 conceptually illustrates a semiconductor device that includes an inductor. Specifically, FIG. 1 illustrates a die 100, a packaging substrate 102, a set of solder balls 104, a printed circuit board (PCB) 106, and an inductor 108. As shown in FIG. 1, the die 100 is coupled to the packaging substrate 102. The packaging substrate 102 is coupled to the PCB 106 through the set of solder balls 104. The inductor 108 is defined and located in the die 100.

FIG. 1 also illustrates that some solder balls have been omitted/removed in a region near the inductor 108. This is because solder balls can affect/disrupt the performance of an inductor. More specifically, solder balls that are near an inductor can disrupt the magnetic flux of an inductor, resulting in a low inductance and low Q factor for the inductor, which is why solder balls are removed in a region near an inductor. However, removing solder balls between a packaging substrate and a PCB can affect the structural stability of the packaging substrate and the PCB. Thus, current IC design must weigh the trade off (e.g., area trade off since removing solder balls implies additional solder balls somewhere else), benefit of removing solder balls (e.g., better inductance and Q factor inductor) versus the disadvantage of removing solder balls (e.g., less stable packaging substrate/PCB structure), when determining how many solder balls to use and where to put solder balls when coupling a die and packaging substrate to a PCB.

Therefore, there is a need for an improved inductor design for integrated devices. Ideally, such an inductor will have better inductance performance, lower resistance and better quality factor value, without having to sacrifice the structural stability of the semiconductor device.

SUMMARY

Various features, apparatus and methods described herein provide a toroid inductor in a semiconductor device.

A first example provides an integrated device that includes a substrate, a first cavity through the substrate, and a toroid inductor configured around the first cavity of the substrate. The toroid inductor includes a set of windings configured around the first cavity. The set of windings includes a first set of interconnects on a first surface of the substrate, a set of through substrate vias (TSVs), and a second set of interconnects on a second surface of the substrate.

According to an aspect, the first set of interconnects is coupled to the second set of interconnects through the set TSVs.

According to one aspect, the integrated device also includes an interconnect material located within the first cavity. The interconnect material configured to couple a die to a printed circuit board. In some implementations, the interconnect material is part of the toroid inductor. In some implementations, the interconnect material is a solder ball.

According to an aspect, the first surface is a top surface and the second surface is a bottom surface.

According to one aspect, the integrated device includes a metal layer on a side wall of the first cavity. The metal layer is coupled to at least one interconnect of the first set of interconnects.

According to an aspect, the integrated device is a wafer level package (WLP).

According to one aspect, the toroid inductor is a choke inductor.

According to an aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

According to an aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes a substrate, a first cavity through the substrate, and an inductive means configured around the first cavity of the substrate. The inductive means includes a set of windings configured around the first cavity. The set of windings includes a first set of interconnects on a first surface of the substrate, the set of through substrate vias (TSVs) and a second set of interconnects on a second surface of the substrate.

According to an aspect, the first set of interconnects is coupled to the second set of interconnects through the set TSVs.

According to one aspect, the apparatus further includes an interconnect material located within the first cavity. The interconnect material is configured to couple a die to a printed circuit board. In some implementations, the interconnect material is part of the inductive means. In some implementations, the interconnect material is a solder ball.

According to an aspect, the first surface is a top surface and the second surface is a bottom surface.

According to one aspect, the apparatus further includes a metal layer on a side wall of the first cavity. The metal layer is coupled to at least one interconnect of the first set of interconnects.

According to an aspect, the integrated device is a wafer level package (WLP).

According to one aspect, the inductive means is a choke inductor.

According to an aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for providing an integrated device. The method provides a substrate. The method provides a first cavity through the substrate. The method provides several second cavities through the substrate. The method provides a metal material in the several second cavities to define several through substrate via (TSVs). The method provides a first set of metal interconnects on a first surface of the substrate. The first set of metal interconnects is coupled to the TSVs. The method provides a second set of metal interconnects on a second surface of the substrate. The second set of metal interconnects is coupled to the TSVs. The TSVs, the first set of metal interconnects and the second set of interconnects are configured to operate as a toroid inductor. The toroid inductor is configured around the first cavity.

According to an aspect, the first set of interconnects is coupled to the second set of interconnects through the set TSVs.

According to one aspect, the method further provides an interconnect material located within the first cavity. The interconnect material is configured to couple a die to a printed circuit board. In some implementations, wherein the interconnect material is part of the toroid inductor. In some implementations, the interconnect material is a solder ball.

According to an aspect, the first surface is a top surface and the second surface is a bottom surface.

According to one aspect, the method further includes providing a metal layer on a side wall of the first cavity. The metal layer is coupled to at least one interconnect of the first set of interconnects.

According to an aspect, the integrated device is a wafer level package (WLP).

According to one aspect, the toroid inductor is a choke inductor.

According to an aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to an integrated device (e.g., semiconductor device) that includes a substrate, a first cavity through the substrate, and a toroid inductor (e.g., inductive means) configured around the first cavity of the substrate. The toroid inductor includes a set of windings configured around the first cavity. The set of windings includes a first set of interconnects on a first surface of the substrate, a set of through substrate vias (TSVs), and a second set of interconnects on a second surface of the substrate. The first set of interconnects is coupled to the second set of interconnects through the set TSVs. In some implementations, the integrated device further includes an interconnect material (e.g., solder ball) located within the first cavity. The interconnect material is configured to couple a die to a printed circuit board (PCB). In some implementations, the interconnect material is part of the toroid inductor. In some implementations, the integrated device further includes a metal layer on a side wall of the first cavity. The metal layer is coupled to at least one interconnect of the first set of interconnects. In some implementations, the integrated device is a wafer level package (WLP). In some implementations, the toroid inductor is a choke inductor.

Figure 1:
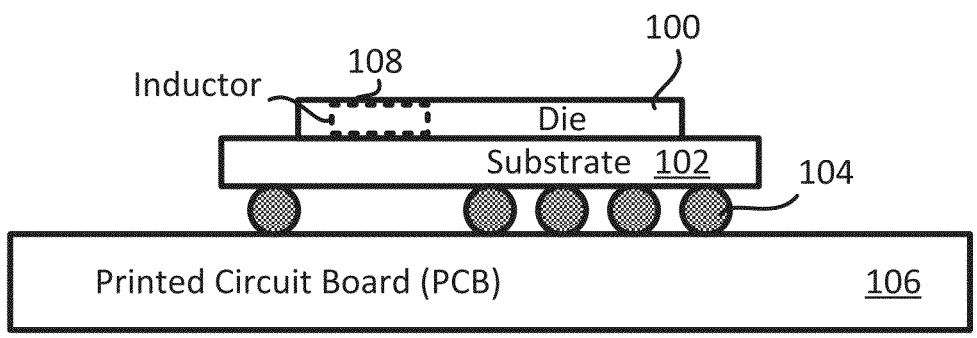
FIG. 1 illustrates conventional inductors in a die.
Figure 2:
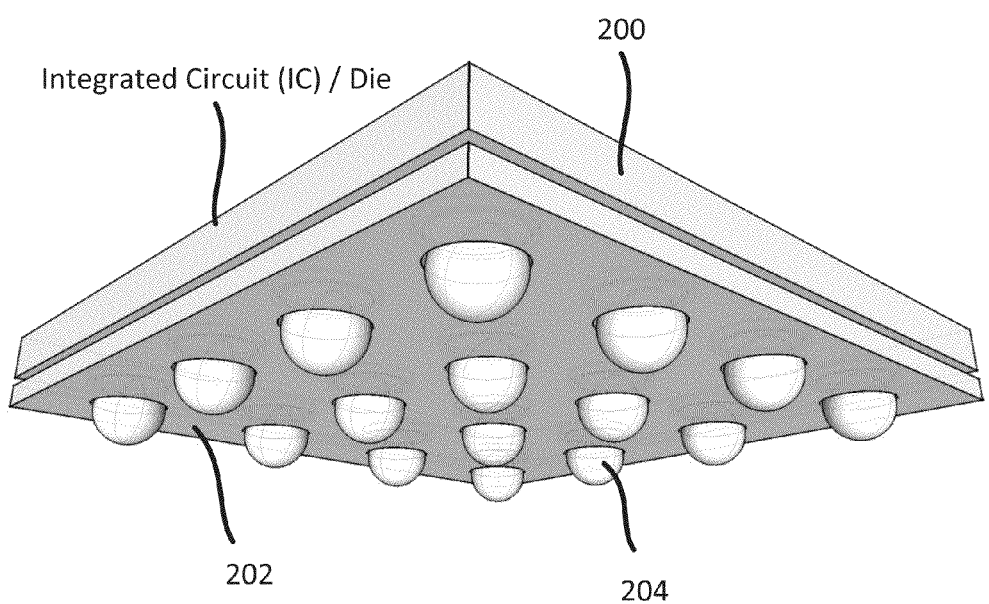
FIG. 2 illustrates an example of an integrated device that includes a toroid inductor.

Exemplary Wafer Level Package (WLP) Integrated Device that Includes a Toroid Inductor FIG. 2 conceptually illustrates a die coupled to a novel integrated device in some implementations. As shown in FIG. 2, an integrated circuit (IC)/die 200 is coupled to an integrated device 202. In some implementations, the IC/die 200 is a wafer level package (WLP) that is manufactured using a wafer level process. In some implementations, the integrated device 202 is a semiconductor device. In some implementations, the integrated device 202 is a wafer level package (WLP) integrated device (e.g., integrated device manufactured using a wafer level process). In some implementations, the integrated device 202 is an integrated passive device structure that includes one or more inductors. Examples of an inductor include a toroid inductor, which will be further described in FIGS. 4, 5, 6, 7, 8, and 9. In some implementations, the inductor (e.g., toroid inductor, inductive means) is manufactured using a wafer level process.

FIG. 2 illustrates individual dies and/or integrated devices. In some implementations, these individual dies and/or integrated device are produced/manufactured from one or more wafers. That is, in some implementations, several dies (e.g., die 200) are manufactured on a wafer, which is then sliced/diced to produce individual dies (e.g., die 200). Similarly, in some implementations, several integrated devices (e.g., integrated device 202) are manufactured on a wafer, which is then sliced/diced to produce individual integrated devices (e.g., integrated device 202). Before further describing the die 200, the integrated device 202, and the solder balls 204, of FIG. 2, an exemplary wafer level process is described below.

In some implementations, a wafer level process is a wafer fabrication process that includes device interconnection and device protection processes before the dicing/slicing of the wafer into individual devices (e.g., die, integrated device, semiconductor device, interposer). In some implementations, a wafer level process includes attaching top and bottom outer layers of a packaging, other integrated devices, and/or the solder balls (e.g., solder bumps), to integrated circuits while the integrated circuits are still in the wafer, and then dicing/slicing the wafer into individual devices (e.g., die, integrated device, semiconductor device).

In some implementations, a wafer level process may includes coupling two wafers (e.g., a first wafer that includes integrated circuits and a second wafer that includes toroid inductors), before dicing/slicing the wafers (e.g., dicing/slicing the first and second wafers at the same time). For example, in some implementations, a first wafer that includes several uncut dies (e.g., die 200) is coupled to a second wafer that includes several uncut integrated devices (e.g., integrated device 202). A set of solder balls (e.g., solder ball 204) may be coupled to the first wafer (before or after the coupling of the first wafer to the second wafer). In some implementations, once the first wafer is coupled to the second wafer, both wafers may be sliced/diced. In some implementations, once the first wafer is coupled to the second wafer, and the solder balls are coupled to the first wafer, the first and second wafers may be sliced/diced. It should be noted that the wafer level process described above is applicable to any of the dies and/or integrated devices described in the present disclosure. Having described an exemplary wafer level process, the die 200, the integrated device 202, and the solder balls 204 of FIG. 2 is further described below.

The integrated device 202 includes a substrate and several cavities/holes. Different implementations may use different materials for the substrate. In some implementations, the substrate is one of at least silicon and/or glass. The cavities/holes traverse the entire substrate. One or more of these cavities/holes are occupied with solder balls 204 (e.g., interconnect material). In some implementations, the combination of the die 200 and the solder balls 204 (e.g., interconnect material) is a wafer level package (WLP) that is manufactured using a wafer level process. In some implementations, the combination of the die 200, the integrated device 202, and the solder balls 204 (e.g., interconnect material) is a wafer level package (WLP) that is manufactured using a wafer level process. In some implementations, an interconnect material (e.g., solder ball) is a material configured to couple a first device (e.g., die, chip) to a second device (e.g., printed circuit board, interposer). In some implementations, the first and/or second device is an integrated device. The integrated device 202 includes a substrate (e.g., glass substrate, silicon substrate) in some implementations. Different implementations may use different materials for the substrate. The integrated device 202 includes several toroid inductors, which are not visible. More specific and detailed examples of substrates, cavities, and toroid inductors in the integrated device 202 will be further described in FIGS. 4, 5, 6, 7, 8 and 9 below.

Having described a wafer level package (WLP) integrated device that includes one or more toroid inductors (e.g., inductive means), a general sequence for providing and/or coupling a WLP integrated device to a die (which may also be a wafer level package) will now be described in FIGS. 3A-3B.

Figure 3A:
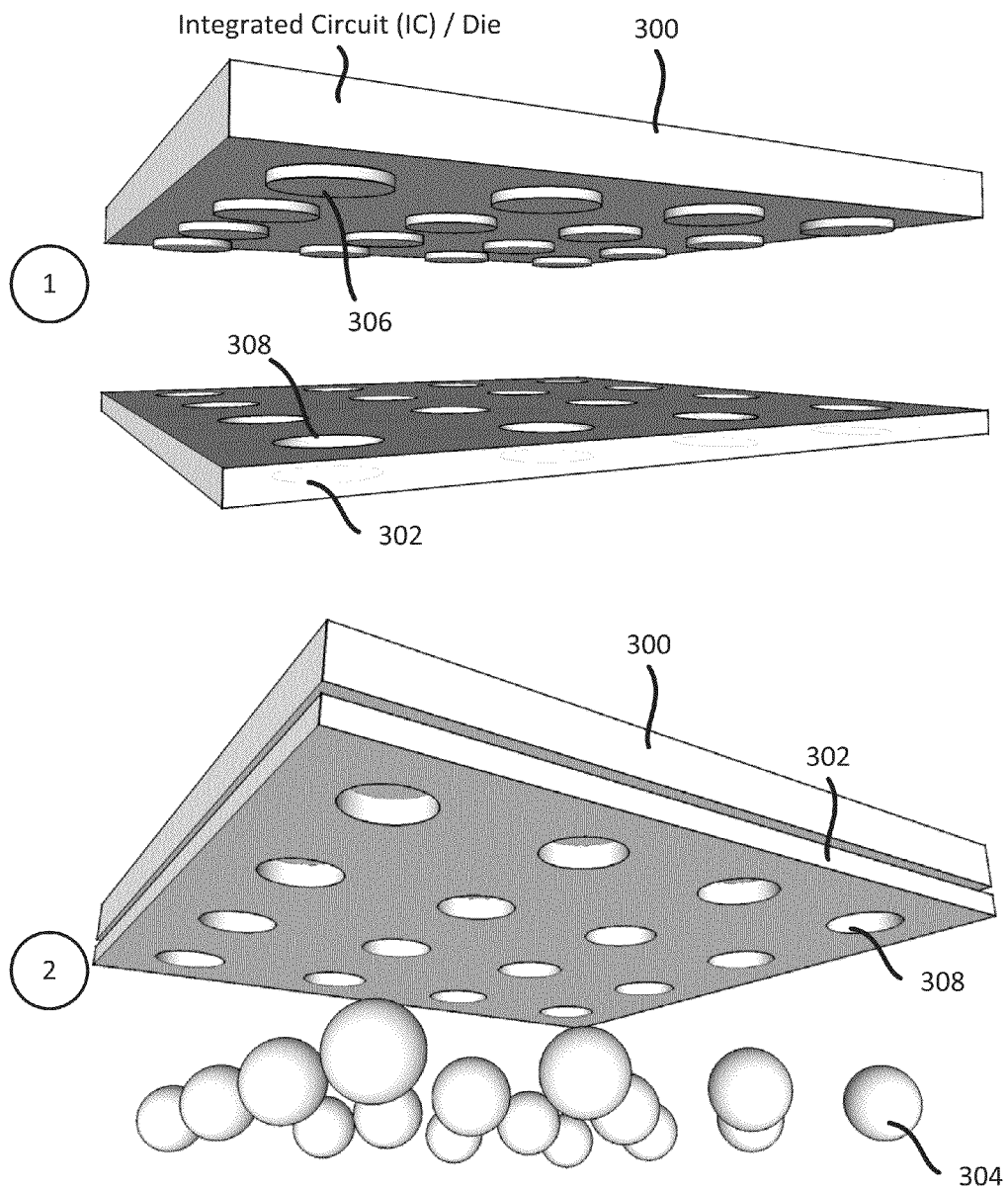
FIG. 3A illustrates an example of part of a sequence for coupling an integrated device that includes a toroid inductor, to a die.
Figure 3B:
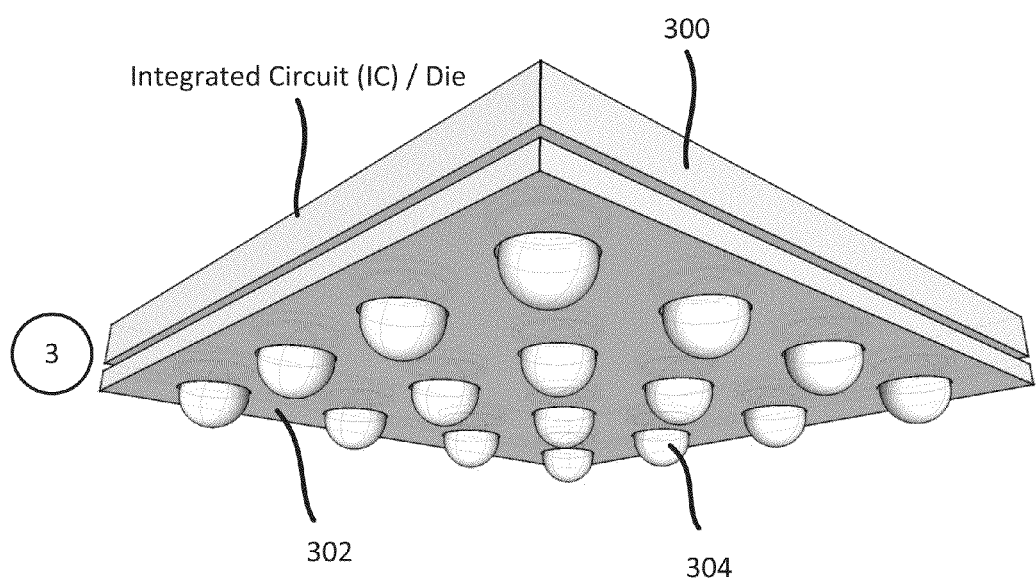
FIG. 3B illustrates an example of part of a sequence for coupling an integrated device that includes a toroid inductor, to a die.

FIGS. 3A-3B illustrate a sequence for coupling a novel integrated device (e.g., wafer level package integrated device that includes one or more toroid inductors) to a die. As shown at stage 1 of FIG. 3A, a die 300 and an integrated device 302 are provided. In some implementations, the die 300 is a wafer level package (WLP) that is manufactured using a wafer level process. In some implementations, the integrated device 302 is a wafer level package (WLP) that is manufactured using a wafer level process. The die 300 includes several pads 306. In some implementations, each pad may include a ball pad, a first integrated passive device (IPD) pad and a second integrated passive pad (IPD) pad. A more specific example of a pad that includes a ball pad, a first IPD pad and a second IPD pad is further described in FIG. 7.

The integrated device 302 includes several cavities/holes 308. One or more cavities/holes 308 are configured to be occupied by solder balls (e.g., set of solder balls, set of interconnect materials). The integrated device 302 also includes one or more toroid inductors (e.g., inductive means), which is not visible. At stage 1, the integrated device 302 may be coupled to the die 300.

At stage 2, solder balls 304 (e.g., interconnect material) are provided and coupled to the die 300 through the cavities/holes 308 of the integrated device 302. In some implementations, the solder balls 304 may be coupled to the die 300 before the integrated device 302 is coupled to the die 300.

Stage 3 of FIG. 3B illustrates the end result of the coupling of the die 300 to the integrated device 302 and the solder ball 304. As shown in stage 3, the solder balls 304 are located in the cavities/holes 308 of the integrated device 302. The solder balls 304 are coupled to the die 300. The integrated device 302 is coupled to the die 300 as well. It should be noted that in some implementations, some of the cavities/holes 308 in the integrated device 302 may be empty. That is, in some implementations, some of the cavities/holes 308 of the integrated device 302 may not be occupied with an interconnect material (e.g., solder ball). In some implementations, the combination of the die 300 and the solder balls 304 (e.g., interconnect material) is a wafer level package (WLP) that is manufactured using a wafer level process. In some implementations, the combination of the die 300, the integrated device 302, and the solder balls 304 (e.g., interconnect material) is a wafer level package (WLP) that is manufactured using a wafer level process.

Figure 4:
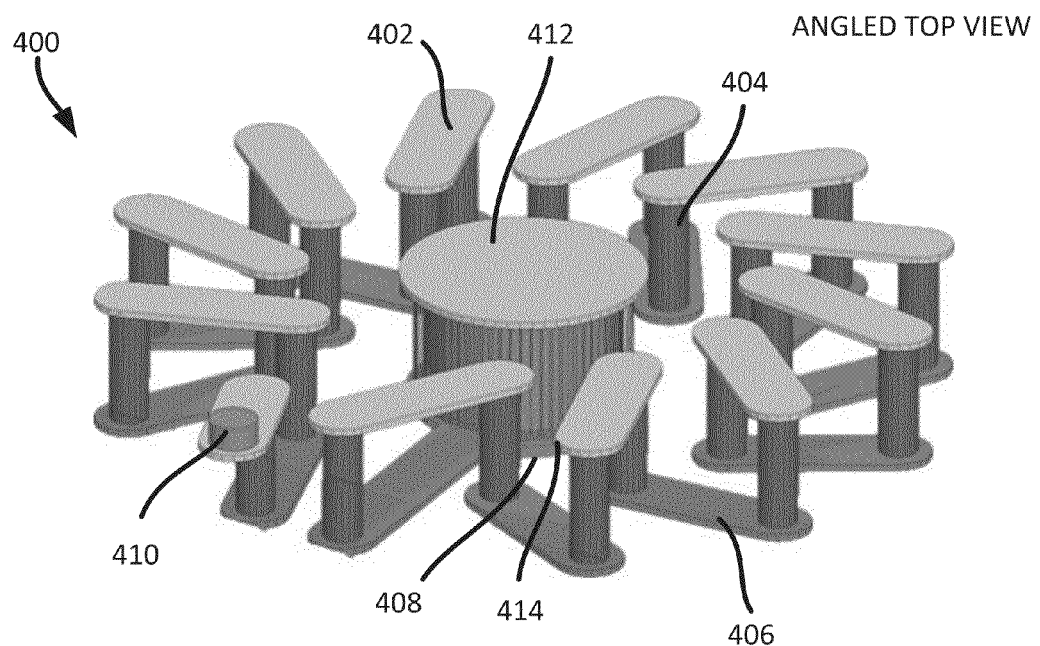
FIG. 4 illustrates an example of an angled view of an integrated device that includes a toroid inductor.
Figure 5:
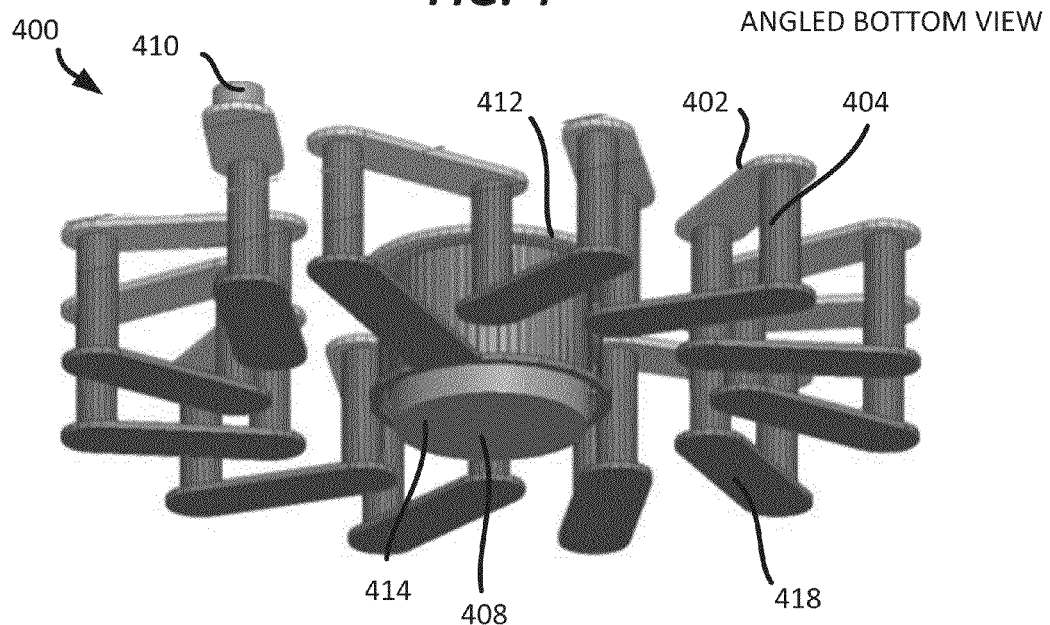
FIG. 5 illustrates an example of an angled view of an integrated device that includes a toroid inductor.

FIGS. 4-5 illustrate a toroid inductor in a substrate. Specifically, FIG. 4 illustrates an angled top view of a toroid inductor 400 configured to be in a substrate. FIG. 5 illustrates an angled bottom view of the toroid inductor 400 configured to be in a substrate. It should be noted that the substrate are not shown in FIGS. 4-5. As shown in FIG. 4, the toroid inductor 400 (e.g., inductive means) includes a set of windings. The set of windings is defined by a first set of interconnects (e.g., traces) 402, a set of through substrate vias (TSVs) 404, and a second set of interconnects (e.g., traces) 406. The first set of interconnects 402 is on a first surface (e.g., top surface) of the substrate. The second set of interconnects 406 is on a second surface (e.g., bottom surface) of the substrate. The set of TSVs 404 traverses the substrate. The first set of interconnects 402 is coupled to the second set of interconnects 406 through the set of TSVs 404. In some implementations, the first set of interconnects 402, the set of TSVs 404, and the second set of interconnects 406 are configured to operate as a toroid inductor (e.g., toroid inductor 400).

In some implementations, the toroid inductor 400 (e.g., inductive means) is positioned in a substrate such that it surrounds a cavity in the substrate. In some implementations, the cavity in the substrate is configured to be occupied by an interconnect material (e.g., solder ball 408). In some implementations, the solder ball is configured to provide a connection between a die and a printed circuit board (PCB). In some implementations, the solder ball (e.g., solder ball 408) that is in the cavity that is surrounded by the toroid inductor 400 is part of the toroid inductor 400. In some implementations, the solder ball is configured to operate with the toroid inductor 400. In some implementations, the first set of interconnects 402, the set of TSVs 404, the second set of interconnects 406, and the solder ball 408 (e.g., interconnect material) are configured to operate as a toroid inductor (e.g., toroid inductor 400).

In some implementations, the toroid inductor 400 is a choke inductor. In some implementations, a choke inductor is an inductor configured for blocking higher-frequency alternating current (AC) in an electrical circuit, while allowing lower frequency or direct current (DC) current to pass. When the toroid inductor 400 is configured as a choke inductor, the first terminal 410 (e.g., port), the second terminal 412, and the third terminal 414 may represent terminals of a choke inductor in a circuit diagram. As shown in FIGS. 4-5, the top and bottom portions of the solder ball 408 may be used as connections points (e.g., ports, terminals) for a choke inductor. As shown in FIGS. 4-5, the second terminal 412 is located at the first portion (e.g., top portion) of the solder ball 408, while the third terminal 414 is located at a second portion (e.g., bottom portion) of the solder ball 408. In some implementations, the second terminal 412 may be located at the ball pad (e.g., ball pad 608) that is connected to the first portion (e.g., top portion) of the solder ball 408. As such, in some implementations, the second terminal 412 of FIGS. 4-5 may represent a first integrated passive device (IPD) pad, a ball pad, a second IPD pad, and a third IPD pad (e.g., first IPD pad 606, ball pad 608, second IPD pad 610, third IPD pad 612), which is further described in FIG. 7. FIGS. 4-5 illustrate that the first terminal 410 is located in the top metal layer (e.g., first set of interconnects) of the substrate. However, in some implementations, the first terminal 410 may be located in the bottom metal layer (e.g., second set of interconnects 406) of the substrate.

Figure 6:
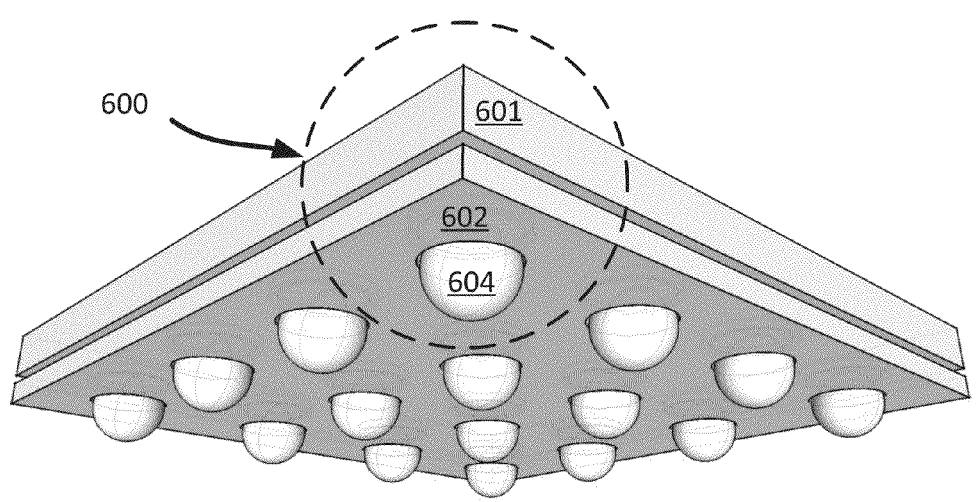
FIG. 6 illustrates an example of an angled view of an integrated device that includes a toroid inductor.
Figure 7:
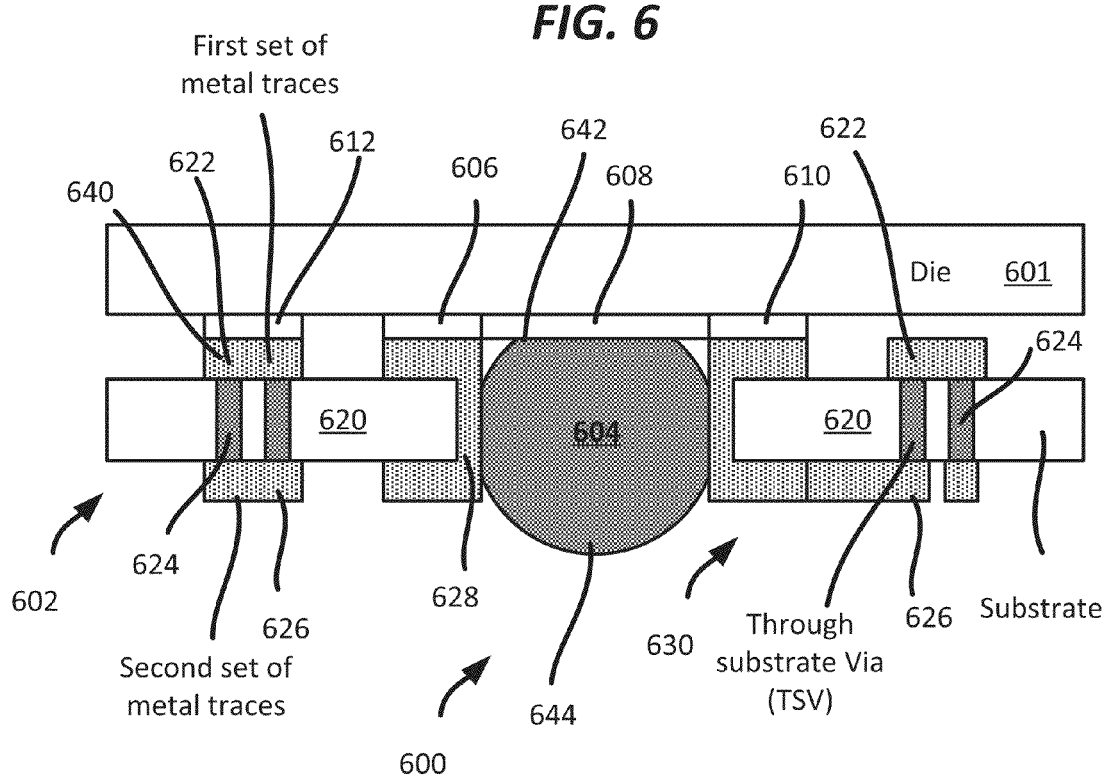
FIG. 7 illustrates an example of a side view of an integrated device that includes a toroid inductor.

FIGS. 6-7 conceptually illustrate how a die (e.g., a wafer level package) may be coupled to a novel integrated device in some implementations. Specifically, FIG. 6 illustrates an angled view of an integrated circuit (IC)/die 601 that is coupled to an integrated device 602. In some implementations, the die 601 is a wafer level package (WLP) integrated device (e.g., integrated device manufactured using a wafer level process). In some implementations, the integrated device 602 is a wafer level package (WLP) integrated device (e.g., integrated device manufactured using a wafer level process). In some implementations, the integrated device 602 is an integrated passive device structure that includes one or more toroid inductors (e.g., toroid inductor 630). The integrated device 602 includes several cavities/holes. One or more of these cavities/holes are occupied with interconnect material (e.g., solder balls 604). In some implementations, one or more of these cavities may be empty (that is at one or more of these cavities may be not be occupied with an interconnect material (e.g., solder ball)). In some implementations, an interconnect material (e.g., solder ball) is a material configured to couple a first device (e.g., die, chip) to a second device (e.g., printed circuit board, interposer). In some implementations, the first and/or second device is an integrated device. In some implementations, the combination of the die 601 and the solder balls 604 (e.g., interconnect material) is a wafer level package (WLP) that is manufactured using a wafer level process. In some implementations, the combination of the die 601, the integrated device 602, and the solder balls 604 (e.g., interconnect material) is a wafer level package (WLP) that is manufactured using a wafer level process.

The integrated device 602 includes a glass substrate in some implementations. However, the substrate can be other materials (e.g., silicon) in some implementations. The integrated device 602 includes several toroid inductors (e.g., toroid inductor 630), which are not visible in FIG. 6.

FIG. 7 illustrates a profile/side view of a portion 600 of the die 601 and the integrated device 602 of FIG. 6. Specifically, FIG. 7 illustrates a side view of an integrated device that includes a novel toroid inductor 630. As shown in FIG. 7, an integrated device 602 is coupled to a die 601. In some implementations, the integrated device 602 is a wafer level package (WLP) manufactured using a wafer level process. A solder ball 604 (e.g., interconnect material) is also coupled to the die 601. The die 601 includes a pad. The pad includes a first integrated passive device (IPD) pad 606, a ball pad 608, a second IPD pad 610, and a third IPD pad 612. The solder ball 604 is coupled to the ball pad 608 of the die 601.

The integrated device 602 includes a substrate 620, a first set of metal interconnects (e.g., traces) 622, a set of through substrate vias (TSVs) 624, a second set of metal interconnects (e.g., traces) 626, and a side metal layer 628. The first set of metal interconnects 622 is located on a first surface (e.g., top surface) of the substrate 620. The set of TSVs 624 traverses the substrate 620. The second set of metal interconnects 626 is located on a second surface (e.g., bottom surface) of the substrate 620. As shown in FIG. 7, one of the metal interconnects from the first set of metal interconnects 622 is coupled to the third IPD pad 612 of the integrated device 602. Specifically, the first terminal 640 is coupled to the third IPD pad 612. In some implementations, the first terminal 640 is an interconnect (e.g., a metal trace). In some implementations, the first terminal 640 is a terminal for the toroid inductor 630. In some implementations, the first set of metal interconnects 622, the set of through substrate vias (TSVs) 624, and the second set of metal interconnects 626 define a set of windings for the toroid inductor 630 in the substrate 620. FIG. 7 illustrates that the solder ball 604 is in contact with the side metal layer 628. However, it should be noted that in some implementations, the solder ball 604 is not in contact with the side metal layer 628.

The side metal layer 628 is on the side wall of the cavity/hole in the substrate 620. The metal layer 628 may be a copper plated layer. The metal layer 628 may be electrically coupled to the first IPD pad 606 and/or the second IPD pad 610. The side metal layer 628 of the integrated device 602 is coupled to the first IPD pad 606 of the die 601. As shown in FIG. 7, the solder ball 604 (e.g., interconnect material) is coupled to the side metal layer 628 and the ball pad 608. In some implementations, the solder ball 604 is configured to provide a connection between the die 601 and a printed circuit board (PCB), which is not shown. In some implementations, the solder ball 604 (e.g., interconnect material) is part of the toroid inductor 630. In some implementations, the toroid inductor 630 (e.g., inductive means) includes the first set of metal interconnects 622, the set of through substrate vias (TSVs) 624, the second set of metal interconnects 626, and the metal layer 628. In some implementations, the toroid inductor 630 (e.g., inductive means) includes the first set of metal interconnects 622, the set of through substrate vias (TSVs) 624, the second set of metal interconnects 626, the metal layer 628, and the solder ball 604 (e.g., interconnect material). In some implementations, the toroid inductor 630 also includes the first IPD pad 606, the ball pad 608, the second IPD pad 610, and the third IPD pad 612.

In some implementations, the die 601 is part of a first wafer, and the integrated device 602 is part of a second wafer. In some implementations, the first wafer that includes several dies (e.g., die 601) is coupled to a second wafer that includes several integrated devices (e.g., integrated device 602). In some implementations, the first and second wafers are sliced/diced together to produce a die (e.g., die 601) that is coupled to an integrated device (e.g., integrated device 602). In some implementations, the first and second wafers are sliced/diced together after a set of solder balls (e.g. solder balls 604) is coupled to the first wafer to produce a die (e.g., die 601) that is coupled to an integrated device (e.g., integrated device 602) and solder balls. In some implementations, the set of solder balls may be coupled to the first wafer before or after coupling the second wafer to the first wafer.

In some implementations, the toroid inductor 630 (e.g., inductive means) is a choke inductor. In some implementations, a choke inductor is an inductor configured for blocking higher-frequency alternating current (AC) in an electrical circuit, while allowing lower frequency or direct current (DC) current to pass. When the toroid inductor 630 is configured as a choke inductor, the first terminal 640 (e.g., port), the second terminal 642, and the third terminal 644 may represent terminals of a choke inductor in a circuit diagram. As shown in FIG. 7, the top and bottom portions of the solder ball 604 may be used as connections points (e.g., ports, terminals) for a choke inductor. As shown in FIG. 7, the second terminal 642 is located at the first portion (e.g., top portion) of the solder ball 604, while the third terminal 644 is located at a second portion (e.g., bottom portion) of the solder ball 604. In some implementations, the second terminal 642 may be located at the ball pad (e.g., ball pad 608) that is coupled to the first portion (e.g., top portion) of the solder ball 604. FIG. 7 illustrates that the first terminal 640 is located in the top metal layer of the substrate. However, in some implementations, the first terminal 640 may be located in the bottom metal layer of the substrate. In some implementations, the first terminal 640 may include the third IPD pad 612.

Exemplary Sequence for Coupling an Integrated Device to a Die

Figure 8:
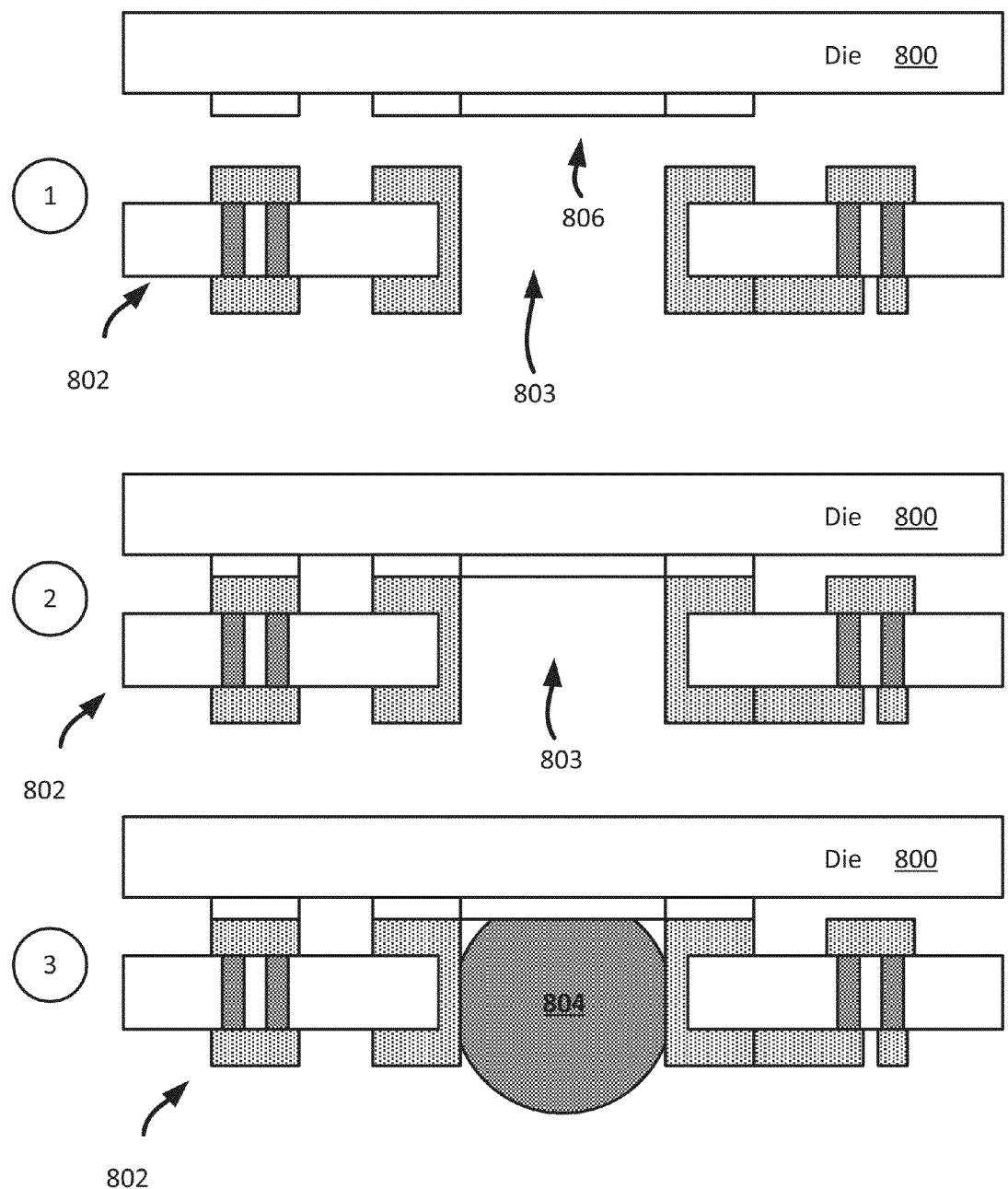
FIG. 8 illustrates an example of a sequence for coupling an integrated device that includes a toroid inductor, to a die.

FIG. 8 illustrates a sequence for coupling a novel integrated device (e.g., wafer level package integrated device that includes one or more toroid inductors) to a die. As shown at stage 1 of FIG. 8, a die 800 and an integrated device 802 are provided. In some implementations, the die 800 is a wafer level package (WLP) that is manufactured using a wafer level process. In some implementations, the integrated device 802 is a wafer level package (WLP) that is manufactured using a wafer level process. In some implementations, the integrated device 802 that includes the toroid inductor is the integrated device 602 of FIG. 7. In some implementations, the integrated device 802 includes the toroid inductor 400 of FIG. 4. The die 800 includes several pads 806. In some implementations, each pad may include a ball pad, a first integrated passive device (IPD) pad and a second integrated passive pad (IPD) pad. A more specific example of a pad that includes a ball pad, a first IPD pad and a second IPD pad was described in FIG. 7.

The integrated device 802 include a cavity 803. The cavity 803 is configured to be occupied by a solder ball (e.g., interconnect material). The integrated device 802 also includes a toroid inductor (e.g., toroid inductor 400). The toroid inductor is defined by a set of windings. The set of windings includes a first set of interconnects, a set of TSVs, a second set of interconnects. At stage 1, the die 800 and the integrated device 802 are provided (e.g., manufactured, supplied).

At stage 2, the die 800 is coupled to the integrated device 802. However, in some implementations, a solder ball 804 (e.g., interconnect material) may be provided and coupled to the die 800 before the coupling of the die 800 and the integrated device 802.

At stage 3, the solder ball 804 is provided and coupled to the die 800. Stage 3 of FIG. 8 illustrates the end result of the coupling of the die 800 to the integrated device 802 and the solder ball 804. As shown in stage 3, the solder ball 804 is coupled to the die 800 through the cavity 803 of the integrated device 802. It should be noted that in some implementations, the cavity 803 in the integrated device 802 may be empty. That is, in some implementations, the cavity 803 of the integrated device 802 may not be occupied with an interconnect material (e.g., solder ball). In some implementations, the combination of the die 800 and the solder ball 804 (e.g., interconnect material) is a wafer level package (WLP) that is manufactured using a wafer level process. In some implementations, the combination of the die 800, the integrated device 802, and the solder ball 804 (e.g., interconnect material) is a wafer level package (WLP) that is manufactured using a wafer level process.

In some implementations, after stage 3, the integrated device and die are coupled to a printed circuit board (PCB). For example, in some implementations, the solder ball 804 (e.g., bottom portion of solder ball 804) may be coupled to a printed circuit board (PCB).

In some implementations, an integrated device may include several cavities (e.g. first cavity, second cavity, third cavity) and several toroid inductors (e.g., first toroid inductor, second toroid inductor). In some implementations, the first toroid inductor may be positioned around the first cavity, and the second toroid inductor may be positioned around the second cavity. In some implementations, the first cavity may includes an interconnect material (e.g., solder ball), while the second cavity may not include an interconnect material (e.g., solder ball). However, it should be noted that different implementations of an integrated device may include different combinations of cavity, toroid inductors and/or interconnect materials (e.g., solder balls).

Figure 9:
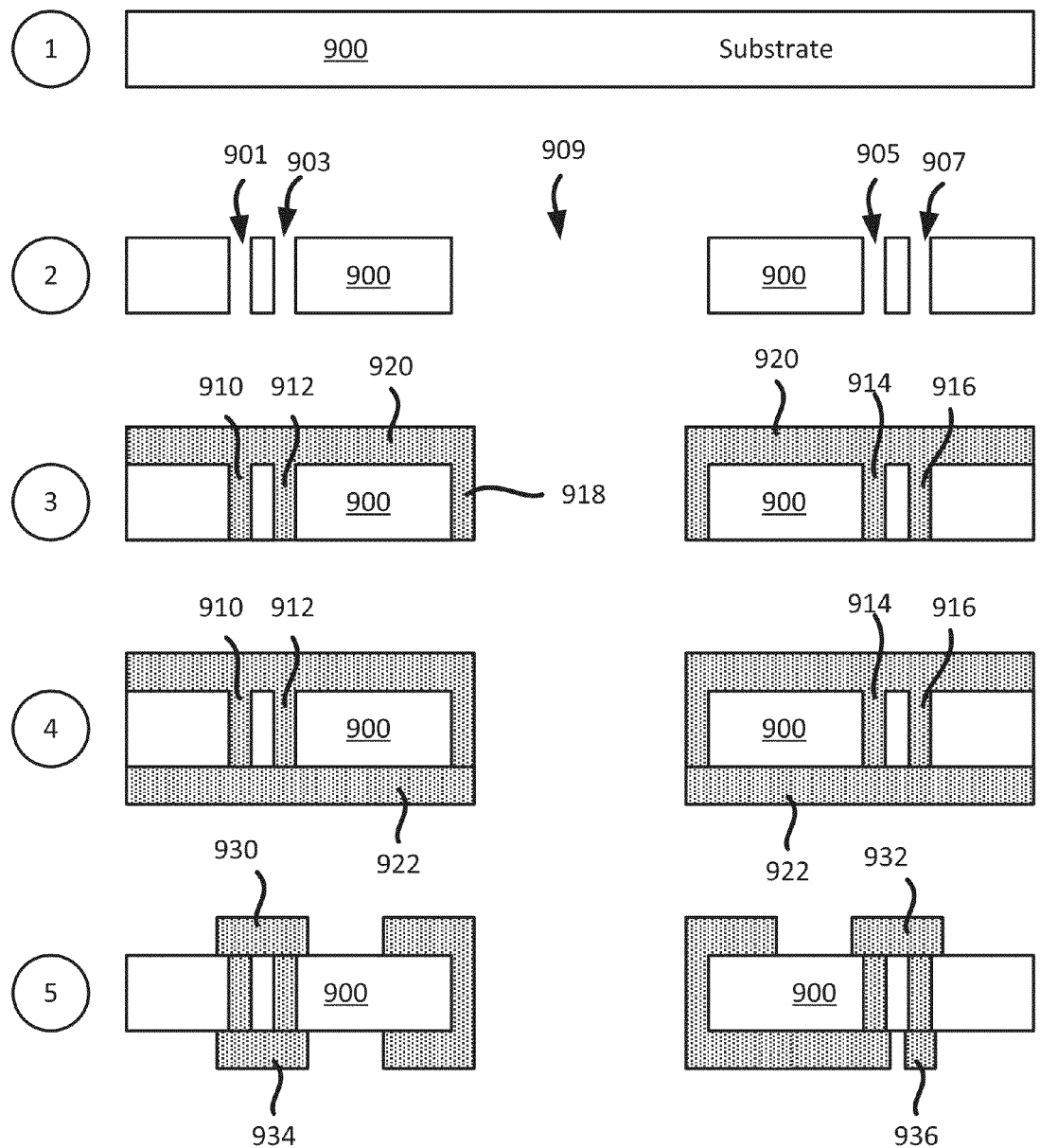
FIG. 9 illustrates an example of a sequence for providing an integrated device that includes a toroid inductor.

Exemplary Sequence for Providing/Manufacturing an Integrated Device that Includes a Toroid Inductor FIG. 9 illustrates an exemplary sequence for providing an integrated device that includes a toroid inductor. In some implementations, the sequence of FIG. 9 may be used to provide/manufacture the integrated device of FIGS. 2, 3A-3B, 4, 5, 6, 7 and/or 8 or other integrated devices described in the present disclosure. In some implementations, the integrated device is a wafer level package (WLP) integrated device (e.g., integrated device manufactured using a wafer level process). In some implementations, the integrated device is an integrated passive device structure that includes one or more toroid inductor. In some implementations, the sequence of FIG. 9 illustrates an example of providing a wafer that includes several integrated devices (e.g., providing an uncut integrated device on a wafer).

As shown in stage 1 of FIG. 9, a substrate (e.g., substrate 902) is provided. In some implementations, the substrate is a wafer. Different implementations may use different materials for the substrate (e.g., silicon substrate, glass substrate). In some implementations, the substrate 900 may be provided from a supplier with a first metal layer on a first surface (e.g., top surface) of the substrate and a second metal layer on a second surface (e.g., bottom surface) of the substrate. In such instances, the first and second metal layers may be removed (e.g., by etching) in some implementations.

At stage 2, several cavities are created in the substrate. As shown at stage 2, a first cavity 901, a second cavity 903, a third cavity 905, a fourth cavity 907, and a fifth cavity 909 are provided in the substrate 900. The cavities (e.g., first cavity 901) traverse the entire substrate 900.

At stage 3, a first metal layer 920 is provided on the substrate 900. In some implementations, the first metal layer 920 is provided on the substrate 900 such that it fills the first cavity 901, the second cavity 903, the third cavity 905, and the fourth cavity 907. The first metal layer 920 is also provided on a first surface (e.g., top surface) of the substrate 900, and the side walls of the fifth cavity 909. In some implementations, filling the first cavity 901, the second cavity 903, the third cavity 905, and the fourth cavity 907 define through substrate vias (TSVs) in substrate 900. In some implementations, the TSVs are configured to be part of a toroid inductor in the substrate 900 in some implementations. As shown at stage 3, filling the first cavity 901, the second cavity 903, the third cavity 905, and the fourth cavity 907, respectively define a first TSV 910, a second TSV 912, a third TSV 914, and a fourth TSV 916. In some implementations, the first TSV 910, the second TSV 912, the third TSV 914, and the fourth TSV 916 are configured to operate as a toroid inductor in the substrate 900. In some implementations, providing the first metal layer 920 on the side walls of the fifth cavity 909 provides a metal layer 918 that is configured to operate as a toroid inductor in the substrate 900. Different implementations may use different processes for providing the first metal layer 920. In some implementations, a plating process is use to provide the first metal layer 920. Different implementations may use different materials for the first metal layer 920. In some implementations, the first metal layer 920 is a copper layer.

At stage 4, a second metal layer 922 is provided on the substrate 900. The second metal layer 922 is provided on a second surface (e.g., bottom surface) of the substrate. Different implementations may use different processes for providing the second metal layer 922. In some implementations, a plating process is use to provide the second metal layer 922. Different implementations may use different materials for the second metal layer 922. In some implementations, the second metal layer 922 is the same as the first metal layer 920. In some implementations, the second metal layer 922 is a copper layer. In some implementations, stage 3 and stage 4 may be performed at the same time and/or simultaneously (e.g., double sided plating).

At stage 5, portions of the first metal layer 920 and the second metal layer 922 are selectively etched to provide/define one or more interconnects (e.g., traces) on one or more surfaces of the substrate 900. In some implementations, these interconnects (e.g., traces) are configured to operate as a toroid inductor in the substrate 900. As shown at stage 5, portions of the first metal layer 920 and portions of the second metal layer 922 are selectively etched. Once the etching is complete, a first interconnect 930, a second interconnect 932, a third interconnect 934, and a fourth interconnect 936 are provided on the substrate 900. In some implementations, the first interconnect 930, the second interconnect 932, the third interconnect 934, and the fourth interconnect 936 are traces on the substrate 900. Specifically, the first and second interconnects 930 & 932 are on a first surface (e.g., top surface) of the substrate 900, and the third and fourth interconnects 934 & 936 are on a second surface (e.g., bottom surface) of the substrate 900. In some implementations, the first interconnect 930, the second interconnect 932, the third interconnect 934, and the fourth interconnect 936 are configured to operate as a toroid inductor in the substrate 900.

In some implementations, the first TSV 910, the second TSV 912, the third TSV 914, the fourth TSV 916, the metal layer 918, the first interconnect 930, the second interconnect 932, the third interconnect 934, and the fourth interconnect 936 are configured to operate as a toroid inductor in the substrate 900. In some implementations, the toroid inductor defined by the first TSV 910, the second TSV 912, the third TSV 914, the fourth TSV 916, the metal layer 918, the first interconnect 930, the second interconnect 932, the third interconnect 934, and the fourth interconnect 936, surrounds a cavity (e.g., cavity 909) in the substrate 900.

In some implementations, the first TSV 910, the second TSV 912, the third TSV 914, the fourth TSV 916, the metal layer 918, the first interconnect 930, the second interconnect 932, the third interconnect 934, and the fourth interconnect 936, are configured to operate as a set of windings for a toroid inductor in the substrate 900, where the set of windings surrounds a cavity (e.g., cavity 909) in the substrate 900.

In some implementations, the cavity (e.g., cavity 909) is configured to be occupied by a solder ball (e.g., interconnect material). In some implementations, the solder ball couples a die to a printed circuit board (PCB). In some implementations, the solder ball is configured to be part of the toroid inductor. As such, in some implementations, the solder ball that is in the cavity (e.g., cavity 909) is configured to operate as a toroid inductor. In some implementations, the toroid inductor is a choke inductor.

Having described an example of a sequence for providing an integrated device that includes a toroid inductor, an example of a method for providing an integrated device that includes a toroid inductor.

Figure 10:
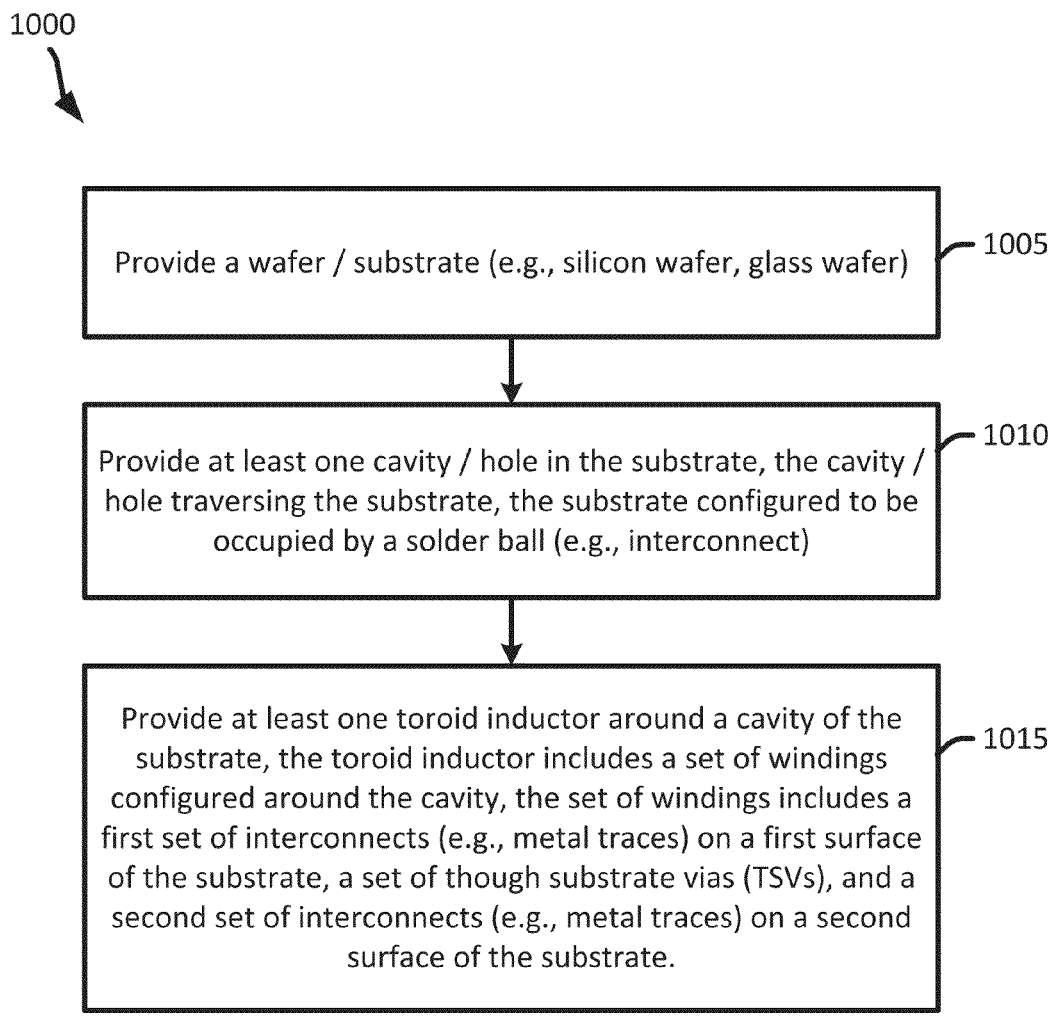
FIG. 10 illustrates an example of a method for providing an integrated device that includes a toroid inductor.

Exemplary Method for Providing/Manufacturing an Integrated Device that Includes a Toroid Inductor FIG. 10 illustrates an exemplary method for providing an integrated device that includes a toroid inductor. In some implementations, the method of FIG. 10 may be used to provide/manufacture the integrated device of FIGS. 2, 3A-3B, 4, 5, 6, 7, 8 and/or 9 or other integrated devices described in the present disclosure. In some implementations, the integrated device is a wafer level package (WLP) integrated device (e.g., integrated device manufactured using a wafer level process). In some implementations, the integrated device is an integrated passive device structure that includes one or more a toroid inductors. In some implementations, the method of FIG. 10 illustrates an example of providing a wafer that includes several integrated devices (e.g., providing an uncut integrated device on a wafer).

The method provides (at 1005) a substrate (e.g., substrate 900). In some implementations, the substrate is a wafer. Different implementations may use different materials for the substrate (e.g., silicon substrate, glass substrate).

The method further provides (at 1010) at least one cavity/hole in the substrate. The cavity/hole traverses the substrate. In some implementations, the cavity/hole is configured to be occupied by an interconnect material (e.g., solder ball).

The method provides (at 1015) a toroid inductor around a first cavity of the substrate. In some implementations, the toroid inductor includes a set of windings configured around the first cavity. In some implementations, the set of windings includes a first set of interconnects on a first surface of the substrate, a set of through substrate vias (TSVs), and a second set of interconnects on a second surface of the substrate. In some implementations, providing (at 1015) the toroid inductor includes creating cavities in the substrate and filling the cavities (e.g., by plating) with a metal layer to define one or more TSVs. In some implementations providing (at 1015) the toroid inductor includes providing a first metal layer on a first surface (e.g., top surface) of the substrate, and a second metal layer on a second surface (e.g., bottom surface) of the substrate, and selectively etching the first and second metal layers to define a set of interconnects. For example, the first metal layer may be selectively etched to define a first set of interconnects (e.g., traces) on the first surface of the substrate, and the second metal layer may be selectively etched to define a second set of interconnects (e.g., traces) on the second surface of the substrate.

In some implementations, the integrated device that is provided (e.g., manufactured) is then coupled to a die (e.g., another wafer level package). In some implementations, solder balls are coupled to the die before the integrated device is coupled to the die. In some implementations, solder balls (e.g., interconnect materials) are provided (e.g., dropped) in one or more of the cavities once the integrated device is coupled to the die. In some implementations, the solder balls are part of the toroid inductor. That is, in some implementations, the solder balls is configured to operate as a toroid inductor. In some implementations, the toroid inductor is a choke inductor.

In some implementations, the integrated device is on a first wafer that includes several integrated devices. In some implementations, the first wafer that includes several integrated devices (e.g., integrated that includes integrated passive device) is coupled to a second wafer that includes several dies (e.g., integrated circuits). In some implementations, the first and second wafers are sliced/diced once the first and second wafers are coupled together. In some implementations, solder balls may be provided and/or coupled to the second wafer (e.g., wafer that includes the dies) through the cavities in the first wafer (e.g., wafer that includes the integrated device) before the first wafer and/or second wafer are diced/sliced.

Figure 11:
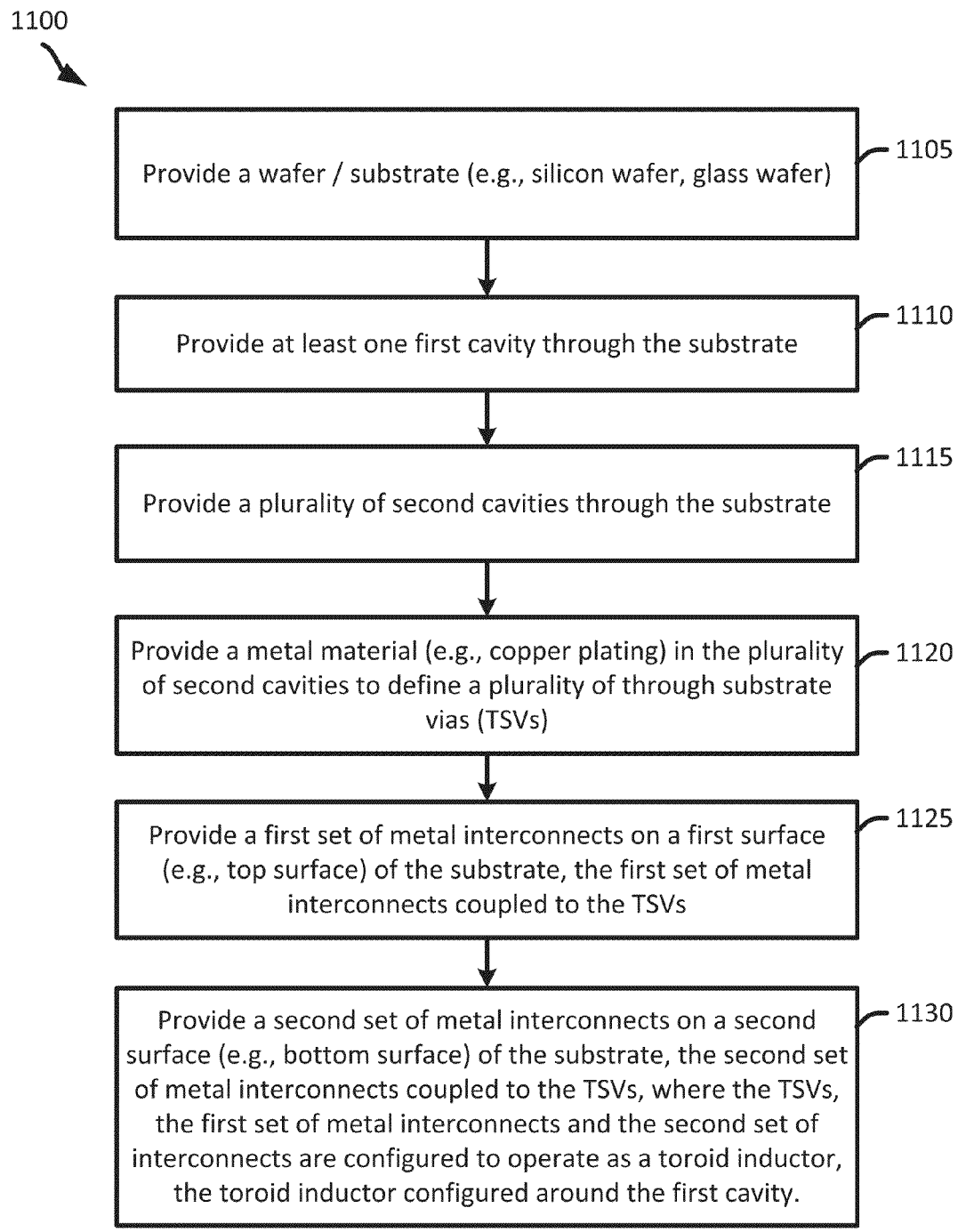
FIG. 11 illustrates another example of a method for providing an integrated device that includes a toroid inductor.

Exemplary Method for Providing/Manufacturing an Integrated Device that Includes a Toroid Inductor FIG. 11 illustrates another exemplary method for providing an integrated device that includes a toroid inductor. In some implementations, the method of FIG. 11 may be used to provide/manufacture the integrated device of FIGS. 2, 3A-3B, 4, 5, 6, 7, 8 and/or 9 or other integrated devices described in the present disclosure. In some implementations, the integrated device is a wafer level package (WLP) integrated device (e.g., integrated device manufactured using a wafer level process). In some implementations, the integrated device is an integrated passive device structure that includes one or more a toroid inductors. In some implementations, the method of FIG. 11 illustrates an example of providing a wafer that includes several integrated devices (e.g., providing an uncut integrated device on a wafer).

The method provides (at 1105) a substrate (e.g., substrate 900). In some implementations, the substrate is a wafer. Different implementations may use different materials for the substrate (e.g., silicon substrate, glass substrate).

The method further provides (at 1110) at least one first cavity/first hole in the substrate. The first cavity/first hole traverses the substrate. In some implementations, the first cavity is configured to be occupied by an interconnect material (e.g., solder ball). In some implementations, providing the at least one first cavity may include drilling a cavity in the substrate. In some implementations, a laser may be used to drill a cavity in the substrate. In some implementations, providing at least one first cavity may include selectively etching (e.g., chemical, mechanical) the substrate.

The method provides (at 1115) a plurality of second cavities/second holes. The second cavities/second holes traverse the substrate. In some implementations, providing the plurality of second cavities may include drilling a plurality of cavities in the substrate. In some implementations, a laser may be used to drill a cavity in the substrate. In some implementations, providing the plurality of second cavities may include selectively etching (e.g., chemical, mechanical) the substrate.

In some implementations, providing (at 1110) at least one first cavity and providing (at 1115) several second cavities are performed concurrently or sequentially.

The method provides (at 1120) a metal material in the plurality of second cavities to define a plurality of through substrate vias (TSVs). In some implementations, providing the metal material (e.g., copper) in the plurality of second cavities includes plating the plurality of second cavities with a metal layer (e.g., copper). However, other implementations may use different processes to provide the metal material (e.g., using a metal paste).

The method provides (at 1125) a first set of metal interconnects on a first surface (e.g., top surface) of the substrate. The first set of metal interconnects is coupled to the TSVs. The first set of metal interconnects may be traces (e.g., copper traces) on the first surface of the substrate. In some implementations, providing (at 1125) the first set of metal interconnects may include providing (e.g., plating) a first metal layer on the first surface of the substrate and selectively etching the first metal layer to define the first set of metal interconnects. In some implementations, the method may also provide a metal layer in a side wall of a cavity (e.g., when providing the first set of metal interconnects).

The method provides (at 1130) a second set of metal interconnects on a second surface of the substrate. The second set of metal interconnects is coupled to the TSVs. The TSVs, the first set of metal interconnects and the second set of interconnects are configured to operate as a toroid inductor. The toroid inductor is configured around the first cavity. The second set of metal interconnects may be traces (e.g., copper traces) on the second surface of the substrate. In some implementations, providing (at 1130) the second set of metal interconnects may include providing (e.g., plating) a second metal layer on the second surface of the substrate and selectively etching the second metal layer to define the second set of metal interconnects.

In some implementations, providing (at 1125) the first set of metal interconnects and providing (at 1130) the second set of metal interconnects may be performed concurrently or sequentially. It should also be noted that the order in which the cavities are provided (e.g., order in which first cavity and/or second cavity are drilled) may be different. For example, in some implementations, the first cavity may be provided after the TSVs, the first set of interconnects, and the second set of interconnects are provided in the substrate.

In some implementations, the integrated device that is provided (e.g., manufactured) is then coupled to a die (e.g., another wafer level package). In some implementations, solder balls are coupled to the die before the integrated device is coupled to the die. In some implementations, solder balls (e.g., interconnect materials) are provided (e.g., dropped) in one or more of the cavities once the integrated device is coupled to the die. In some implementations, the solder balls are part of the toroid inductor. That is, in some implementations, the solder ball is configured to operate as a toroid inductor. In some implementations, the toroid inductor is a choke inductor.

In some implementations, the integrated device is on a first wafer that includes several integrated devices. In some implementations, the first wafer that includes several integrated devices (e.g., integrated that includes integrated passive device) is coupled to a second wafer that includes several dies (e.g., integrated circuits). In some implementations, the first and second wafers are sliced/diced once the first and second wafers are coupled together. In some implementations, solder balls may be provided and/or coupled to the second wafer (e.g., wafer that includes the dies) through the cavities in the first wafer (e.g., wafer that includes the integrated device) before the first wafer and/or second wafer are diced/sliced.

Exemplary Electronic Devices

Figure 12:
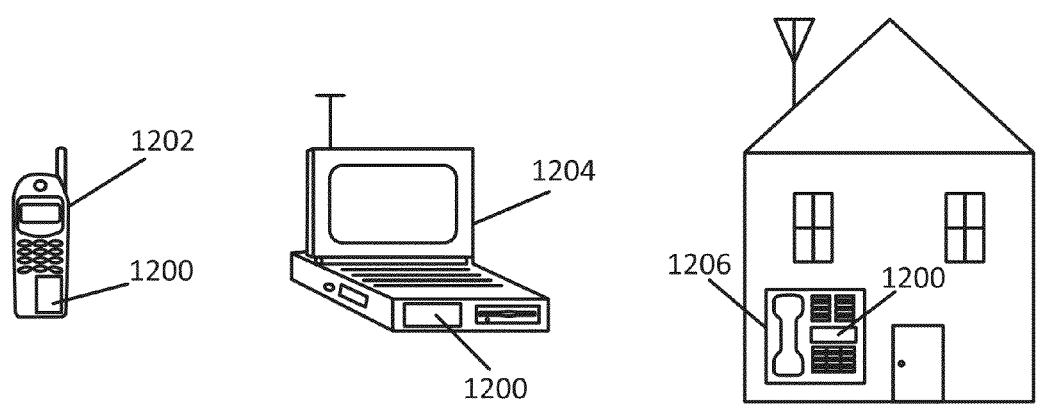
FIG. 12 illustrates various electronic devices that may integrate an integrated device, a die, an integrated circuit and/or PCB described herein.

FIG. 12 illustrates various electronic devices that may be integrated with any of the aforementioned integrated device (e.g., semiconductor device), integrated circuit, die, interposer and/or package. For example, a mobile telephone 1202, a laptop computer 1204, and a fixed location terminal 1206 may include an integrated circuit (IC) 1200 as described herein. The IC 1200 may be, for example, any of the integrated devices, integrated circuits, dice or packages described herein. The devices 1202, 1204, 1206 illustrated in FIG. 12 are merely exemplary. Other electronic devices may also feature the IC 1200 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3A-3B, 4, 5, 6, 7, 8, 9, 10, 11, and/or 12 may be rearranged and/or combined into a single component, step, feature or function or embodied in several components, steps, or functions. Additional elements, components, steps, and/or functions may also be added without departing from the invention.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
   a die; and
   a substrate coupled to the die, the substrate comprising;
      a first cavity through the substrate;
      a solder interconnect located in the first cavity, wherein the solder interconnect is coupled to the die; and
      a toroid inductor configured around the first cavity of the substrate and the solder interconnect in the first cavity, the toroid inductor comprising a set of windings configured around the first cavity and the solder interconnect, the set of windings comprising a first set of interconnects on a first surface of the substrate, a set of through substrate vias (TSVs), and a second set of interconnects on a second surface of the substrate.

2. The integrated device of claim 1, wherein the first set of interconnects is coupled to the second set of interconnects through the set of TSVs.

3. The integrated device of claim 1, wherein the solder interconnect is configured to couple the die to a printed circuit board.

4. The integrated device of claim 1, wherein the toroid inductor includes the solder interconnect.

5. The integrated device of claim 1, wherein the solder interconnect includes a solder ball.

6. The integrated device of claim 1, wherein the first surface is a top surface and the second surface is a bottom surface.

7. The integrated device of claim 1 further comprising a metal layer on a side wall of the first cavity, the metal layer coupled to at least one interconnect of the first set of interconnects.

8. The integrated device of claim 1, wherein the integrated device is a wafer level package (WLP).

9. The integrated device of claim 1, wherein the toroid inductor is a choke inductor.

10. The integrated device of claim 1, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

11. An apparatus comprising:
    a die; and
    a substrate coupled to the die, the substrate comprising;
       a first cavity through the substrate;
       a solder interconnect located in the first cavity, wherein the solder interconnect is coupled to the die; and
       an inductive means configured around the first cavity of the substrate and the solder interconnect in the first cavity.

12. The apparatus of claim 11, wherein the inductive means comprises a set of windings configured around the first cavity and the solder interconnect, the set of windings comprising a first set of interconnects on a first surface of the substrate, a set of through substrate vias (TSVs), and a second set of interconnects on a second surface of the substrate, and
    wherein the first set of interconnects is coupled to the second set of interconnects through the set of TSVs.

13. The apparatus of claim 11, wherein the solder interconnect is configured to couple the die to a printed circuit board.

14. The apparatus of claim 11, wherein the inductive means includes the solder interconnect.

15. The apparatus of claim 11, wherein the solder interconnect includes is a solder ball.

16. The apparatus of claim 12, wherein the first surface is a top surface and the second surface is a bottom surface.

17. The apparatus of claim 11, wherein the inductive means comprises a metal layer on a side wall of the first cavity, and wherein the metal layer is coupled to at least one interconnect from a first set of interconnects of the inductive means.

18. The apparatus of claim 11, wherein the apparatus is a wafer level package (WLP).

19. The apparatus of claim 11, wherein the inductive means is a choke inductor.

20. The apparatus of claim 11, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

21. A method for fabricating an integrated device, comprising:
- providing a die;
- coupling a substrate to the die, wherein coupling the substrate to the die comprises:
  - providing the substrate;
  - forming a first cavity through the substrate;
  - providing a solder interconnect that is coupled to the die, in the first cavity of the substrate;
  - forming a plurality of second cavities through the substrate;
  - forming a metal material in the plurality of second cavities to define a plurality of through substrate via (TSVs);
  - forming a first set of metal interconnects on a first surface of the substrate such that the first set of metal interconnects is coupled to the TSVs; and
  - forming a second set of metal interconnects on a second surface of the substrate such that the second set of metal interconnects is coupled to the TSVs,
  - wherein forming the TSVs, forming the first set of metal interconnects and forming the second set of interconnects comprises forming a toroid inductor configured around the first cavity and the solder interconnect in the first cavity.

22. The method of claim 21, wherein the first set of interconnects is coupled to the second set of interconnects through the plurality of TSVs.

23. The method of claim 21, wherein the solder interconnect is configured to couple the die to a printed circuit board.

24. The method of claim 21, wherein forming the toroid inductor includes coupling the solder interconnect to the first set of metal interconnects.

25. The method of claim 21, wherein the solder interconnect includes, a solder ball.

26. The method of claim 21, wherein the first surface is a top surface and the second surface is a bottom surface.

27. The method of claim 21, wherein coupling the substrate to the die comprises forming a metal layer on a side wall of the first cavity such that the metal layer is coupled to at least one interconnect of the first set of interconnects.

28. The method of claim 21, wherein the integrated device is a wafer level package (WLP).

29. The method of claim 21, wherein the toroid inductor is a choke inductor.

30. The method of claim 21, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

* * * * *